US006783591B1

United States Patent
Halliyal et al.

(10) Patent No.: US 6,783,591 B1
(45) Date of Patent: Aug. 31, 2004

(54) LASER THERMAL ANNEALING METHOD FOR HIGH DIELECTRIC CONSTANT GATE OXIDE FILMS

(75) Inventors: Arvind Halliyal, Cupertino, CA (US); Nicholas H. Tripsas, San Jose, CA (US); Mark T. Ramsbey, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 51 days.

(21) Appl. No.: 10/212,237

(22) Filed: Aug. 6, 2002

(51) Int. Cl.[7] ............................................... C30B 25/04
(52) U.S. Cl. ............................ 117/89; 117/41; 117/84; 117/104; 438/151

(58) Field of Search ............................... 117/41, 84, 89, 117/104; 438/151

(56) References Cited

U.S. PATENT DOCUMENTS 6,455,875 B2 * 9/2002 Takemura et al. ............. 257/72
6,620,668 B2 * 9/2003 Lee et al. ..................... 438/199

* cited by examiner

*Primary Examiner*—Felisa Hiteshew
(74) *Attorney, Agent, or Firm*—McDermott Will & Emery LLP

(57) ABSTRACT

A method of manufacturing a semiconductor device, including depositing a gate oxide film over a substrate and conditioning the deposited gate oxide film using laser thermal annealing in a single process chamber, and depositing a gate electrode film over the conditioned gate oxide film.

15 Claims, 3 Drawing Sheets

US 6,783,591 B1

LASER THERMAL ANNEALING METHOD FOR HIGH DIELECTRIC CONSTANT GATE OXIDE FILMS

FIELD OF THE INVENTION

The present invention relates to the manufacturing of semiconductor devices, and more particularly, to an in-situ laser thermal anneal method for high dielectric constant (high-k) gate oxide films for complementary metal-oxide-semiconductor (CMOS) devices.

BACKGROUND OF THE INVENTION

Over the last few decades, the semiconductor industry has undergone a revolution by the use of semiconductor technology to fabricate small, highly integrated electronic devices, and the most common semiconductor technology presently used is silicon-based. A large variety of semiconductor devices have been manufactured having various applications in numerous disciplines. One silicon-based semiconductor device is a complementary metal-oxide-semiconductor (CMOS) transistor. The CMOS transistor is one of the basic building blocks of most modern electronic circuits. Importantly, these electronic circuits realize improved performance and lower costs, as the performance of the CMOS transistor is increased and as manufacturing costs are reduced.

A typical CMOS semiconductor device includes a semiconductor substrate on which a gate electrode is disposed. The gate electrode, which acts as a conductor, is separated from the substrate by an insulating layer typically made from a gate oxide film, such as silicon oxide ($SiO_2$). Source and drain regions are typically formed in regions of the substrate adjacent the gate electrode by doping the regions with a dopant of a desired conductivity. The insulating layer is provided to prevent current from flowing between the gate electrode and the source, or drain regions.

In operation, a voltage is typically developed between the source and drain terminals. When an input voltage is applied to the gate electrode, a transverse electric field is set up in the channel region below the gate oxide and between the source and drain regions. By varying the transverse electric field, it is possible to modulate the conductance of the channel region between the source and drain regions. In this manner an electric field is used to control the current flow through the channel region.

Since 1994, the International Technology Roadmap for Semiconductors (ITRS) has recommended a steady reduction in silicon device size, with an accompanying improvement in device performance, measured predominantly by circuit speed. The ITRS has served as a sort of "how-to" guide for the preservation of Moore's Law, the time-honored pronouncement of these ever-increasing component densities. While a variety of new materials and processes have been added to silicon process technology to maintain this rate of device scaling, the primary limitation has been in the area of photolithography and the ability to pattern and etch the ever-smaller device features. Recently, however, it has become clear that this steady scaling of feature sizes may be limited by the thickness of gate oxide films made of $SiO_2$. This impending barrier has led to the development of new dielectrics as potential replacements for $SiO_2$, known collectively as high-k dielectrics that do not limit the thickness of gate oxide films. Examples of possible high-k gate oxide materials include silicon oxynitride ($Si_3N_4$), oxynitrides ($Si_xN_yO_z$), aluminum oxide ($Al_2O_3$), tantalum pentoxide ($Ta_2O_5$), hafnium oxide ($HfO_2$), zirconium oxide ($ZrO_2$), and barium strontium titanate ($BaSrTiO_3$).

In any event, the formation of the high-k gate oxide film is such an early step in processing the CMOS device, that the high-k gate oxide film becomes critical to the quality of the finished CMOS device. In particular, it is important to obtain a high-k gate oxide film over the substrate that has a uniform thickness and a controlled microstructure. Accordingly, a need exists for an improved method of depositing a high-k gate oxide film over a substrate.

SUMMARY OF THE INVENTION

This and other needs are met by embodiments of the present invention which provide an improved method for forming a gate oxide film over a substrate including depositing at least one layer of a gate oxide film over a substrate using a chemical vapor deposition, and conditioning the layer of gate oxide film using laser thermal annealing in an in-situ manner.

The method of the present invention produces gate oxide films having a uniform thickness and a controlled microstructure. The method of the present invention also produces gate oxide films that are relatively free of stress, voids, and excess carbon and organic surface material.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DETAILED DESCRIPTION OF THE INVENTION

The present invention provides an improved method of forming a gate oxide film as part of a complementary metal-oxide-semiconductor (CMOS) device, prior to depositing a gate electrode film over the gate oxide film. In particular, the improved method of the present invention uses laser thermal annealing to provide gate oxide films having uniform thickness and controlled microstructures. The method of the present invention also produces oxide films that are relatively free of stress, voids, and excess carbon and organic surface material. The laser thermal annealing is conducted in-situ during deposition of the gate oxide film.

Figure 1:
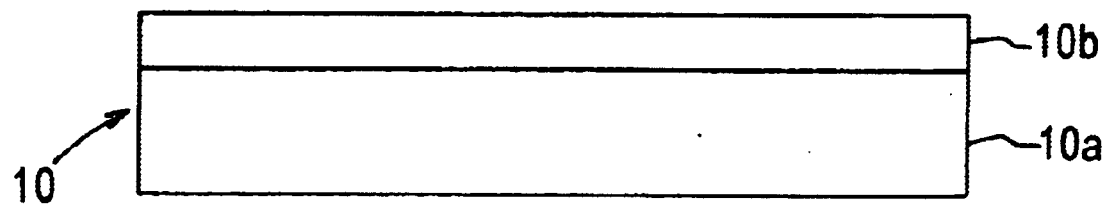
FIGS. 1–7 schematically illustrate sequential phases of a CMOS fabrication method including a laser thermal annealing process in conjunction with chemical vapor deposition according to an embodiment of the present invention.

An embodiment of the present invention is illustrated in FIGS. 1–7. In FIG. 1 a silicon substrate 10 is provided and can be formed from any material suitable for integrated circuit manufacture. The present invention is not limited to any particular type of semiconductor substrate. However, in one aspect, the substrate is formed from single-crystal silicon, and which has been slightly doped with n-type and p-type impurities to form an n-type silicon layer 10*a* and a p-type silicon epitaxy layer 10*b*. Separate CMOS devices are separated on the silicon substrate using isolation structures, such as a field oxide or a shallow isolation trench (not shown).

Figure 2:
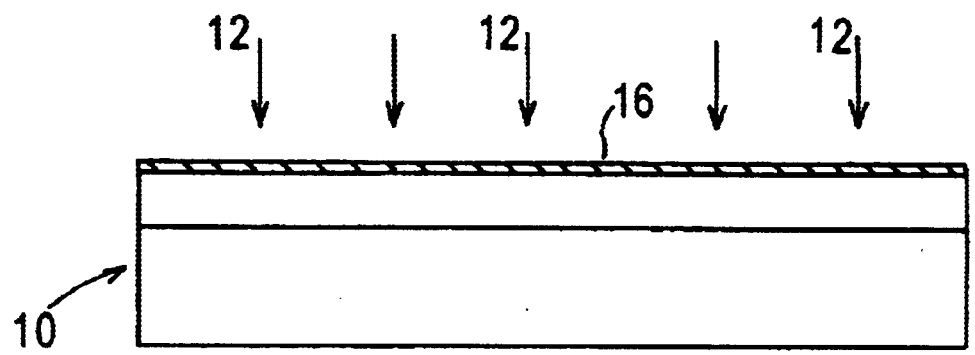

In FIG. 2, a gate oxide 16 is formed on the top surface of the substrate 10. The gate oxide 16 is conventionally silicon dioxide, a standard dielectric constant (standard-K) dielectric material. But in the present invention, the silicon dioxide may be fully or partially replaced with a mid-K or a high-K dielectric material.

As used herein, the term "standard-K dielectric material" refers to a dielectric material having a K up to about 10. Such standard-K dielectric materials include, for example, silicon dioxide, which has a K of about 4, silicon oxynitride, which has a K of about 4–8 depending on the relative content of oxygen and nitrogen, and silicon nitride, which has a K of about 6–9, and aluminum oxide, which has a K of about 10.

As used herein, the term "mid-K dielectric material" refers to a dielectric material having a K in the range from greater than 10 to about 20. Such mid-K dielectric materials include, for example, composite materials such as hafnium silicate, which has a K of about 14, and hafnium silicon oxynitride, which has a K of about 16, depending on the relative content of oxygen and nitrogen, and hafnium silicon nitride, which has a K of about 18.

As used herein, the term "high-K dielectric material" refers to a dielectric material having a K of about 20 or more. Such high-K dielectric materials include, for example, $HfO_2$, $ZrO_2$ and others, some of which are identified more fully below. In general, the term "high-K dielectric material" encompasses binary, ternary and higher oxides and any ferroelectric material having a K of about 20 or more.

As used herein, the term "composite dielectric material" refers to a dielectric material comprising the elements of at least two other dielectric materials. A composite dielectric material may have a K value of a standard-K, mid-K or high-K dielectric material, depending on the elements combined to form the composite dielectric material. As described in more detail below, a composite dielectric material may be formed by co-deposition of its component elements, or by sequential deposition followed by a treatment step, e.g., thermal treatment, to combine the elements to form the composite dielectric material.

Using a high-K dielectric material allows for the use of a thicker gate oxide film. For example, a high-K dielectric material gate oxide film with a K of 40 and a thickness of 100 angstroms is substantially electrically equivalent to a silicon dioxide gate oxide film (K about 4) having a thickness of about 10 angstroms. The electrically equivalent thickness of high-K materials may be referred to in terms of the equivalent oxide thickness. Thus, the thicker high-K material has an equivalent oxide thickness of a thinner silicon dioxide material. By using the high-K material, the reliability problems associated with very thin dielectric layers may be avoided while transistor performance is increased.

It is noted that the K-values, or relative permittivity, for both standard-K and high-K dielectric materials may vary to some degree depending on the exact nature of the dielectric material and on the process used to deposit the material. Thus, for example, differences in purity, crystallinity and stoichiometry, may give rise to variations in the exact K-value determined for any particular dielectric material. In addition, as used herein, when a material is referred to by a specific chemical name or formula, the material may include non-stoichiometric variations of the stoichiometrically exact formula identified by the chemical name. Thus, in the present disclosure, exact stoichiometry is intended only when such is explicitly so stated. As will be understood by those of skill in the art, such variations may occur naturally, or may be sought and controlled by selection and control of the conditions under which materials are formed.

Figure 8:
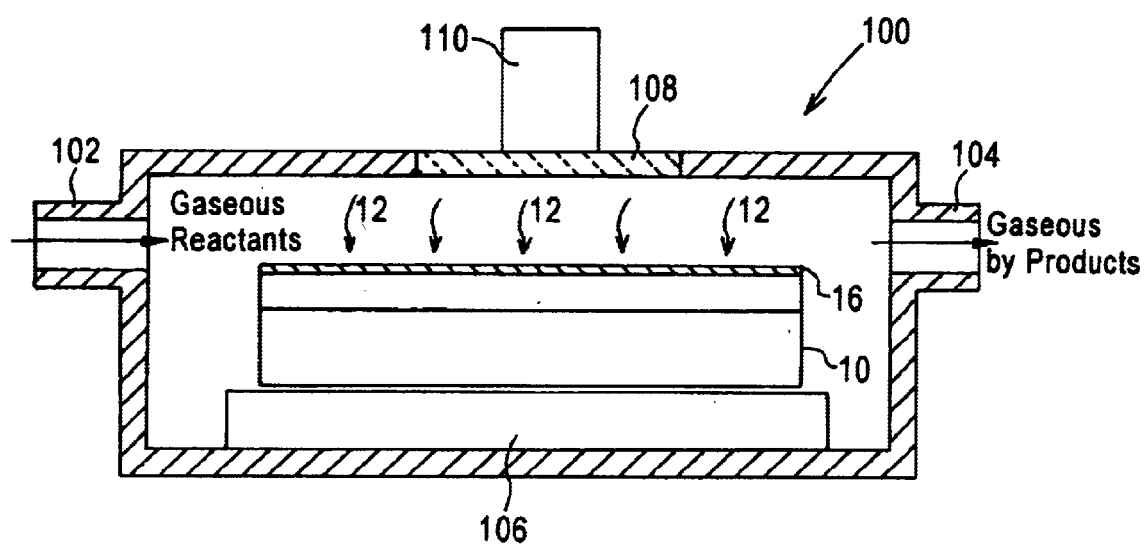
FIG. 8 schematically illustrates a CMOS device positioned in a process chamber adapted to carry out laser thermal annealing in conjunction with chemical vapor deposition according to an embodiment of the present invention.

Referring back to FIG. 2, and also referring to FIG. 8, the gate oxide film is formed by a deposition process including, but not limited to: chemical vapor deposition (CVD), plasma-assisted CVD, metal organic CVD, atomic layer CVD, sputtering and other like deposition processes. For example, if a mid-K or high-K dielectric material is used, the material is deposited by any appropriate CVD method known in the art for deposition of a high-K material, such as an atomic layer CVD process, a metal organic CVD process, or a rapid thermal CVD process.

The mid-K or high-K dielectric material may be formed by reacting a suitable metal containing gas, e.g., hafnium tetra-t-butoxide with a suitable oxygen-containing gas, e.g., oxygen ($O_2$) or nitrous oxide ($N_2O$) in, e.g., the CVD apparatus. In an embodiment in which the CVD is a rapid thermal CVD, the rapid thermal CVD mid-K or high-K dielectric material deposition may be carried out in multiple steps including an initial temperature ramp, a deposition step, and cool-down step.

Atomic layer CVD may be used to deposit a dielectric material in layers as thin as a molecular monolayer, which may also be referred to as a nanolayer. Formation of such nanolayers allows formation of a nano-laminate structure of any selected dielectric materials. The nano-laminate structure provides for deposition of a plurality of different high-K dielectric materials as sub-layers or nanolayers. The sub-layers may be deposited with single dielectric materials or with a plurality of simultaneously formed dielectric materials. The nano-laminates may thus form a composite high-K dielectric material layer.

In any event, the deposition process is carried out for a period of time and at gas flow rates sufficient to form a mid-K or high-K dielectric material-comprising layer having a thickness of about 10 to about 300 angstrom. In another embodiment, the process is carried out for a period of time and at gas flow rates sufficient to form a mid-K or high-K dielectric material-comprising layer having a thickness of about 10 to about 100 angstrom.

Still referring to FIG. 2 and FIG. 8, a method of forming a gate oxide film 16 carried out in accordance with an exemplary embodiment of the present invention also includes using a laser thermal annealing process in-situ with the deposition process. The energy from the laser, represented by arrows 12, is applied to the gate oxide film 16 after the film has been deposited on the substrate, but while the wafer is still in the deposition chamber. An example of a laser capable of providing this energy is a spatially homogenized 308 nm XeCl pulsed laser, although the invention is not limited in this manner, and the energy and power of the laser can vary in accordance with different applications. If the gate oxide film 16 is deposited in successive layers, the laser thermal annealing can be conducted on each layer.

The energy from the laser is applied to the deposited gate oxide film 16 such that the film melts. Then the gate oxide film 16 is allowed to rapidly cool, within about one microsecond, and reform epitaxially. In so doing, damage caused by the deposition process, such as surface voids and excess organics and carbon, is removed. The energy fluence of the laser at the surface of the film 16 determines the melt duration that occurs at the surface, and melt duration is related to maximum melt depth. The relationship between melt duration and maximum melt depth depends on the temporal profile of the laser beam. Precise control of melt depth is possible due to the capability of measuring the full width height maximum (FWHM) of the laser and the surface melt duration during the process. Relatively large changes in the energy fluence are required to create small changes in the maximum melt depth. The total melt time can be varied by varying the number and/or energy of the laser pulses.

The fluence range for laser irradiation can extend from about 50 $mJ/cm^2$ to about 1.3 $J/cm^2$. However, the fluence of the laser can be advantageously controlled to melt only to a depth that the gate oxide film 16 has been amorphitized because amorphous gate oxide absorbs energy at a higher rate than crystalline gate oxide. For example, a fluence of about 400 $mJ/cm^2$ can be used to melt amorphous gate oxide and not melt crystalline gate oxide, if any.

By melting and rapidly cooling the deposited gate oxide film 16 using laser thermal annealing, in an in-situ procedure, the crystallinity and microstructure of the film can be controlled, such that film has uniformly small grain sizes. Surface voids can be removed from the film 16 and stresses in the film can be reduced. The laser thermal annealing can be carried out in multiple steps, such as melting the gate oxide film 16 at low power and then nucleating and growing the grains of the film such that the grains have an average size between about 10 and 100 angstroms.

As illustrated in FIG. 8, the combined deposition and laser thermal annealing method of the present invention is carried out in a single process chamber 100. In this manner, the laser thermal annealing is conducted "in-situ" during the deposition process. As shown, the process chamber 100 generally includes an inlet port 102 and an outlet port 104. A heater 106 is positioned within the chamber 100 for supporting and heating the semiconductor device 10 during the combined deposition and laser thermal annealing method. The deposition is carried out by introducing gaseous reactants into the chamber 100 through the inlet port 102, while heating the semiconductor device 10 with the heater 106 such that a portion of the reactants react and become deposited as layer 16 on the device 10. Gaseous byproducts are then removed from the chamber 10 through the outlet port 104.

The chamber 100 also includes a laser-transparent window 108. A laser 110 for conducting the laser thermal annealing is positioned so as to direct laser energy through the window 108 and against the deposited layer 16 of the semiconductor device 10 contained within the chamber 100, as illustrated by arrows 12. Although not shown, the chamber 100 and the laser 110 can further include such components as a power source, fluid control devices, and a control system including a computer and user-interface devices.

Figure 3:
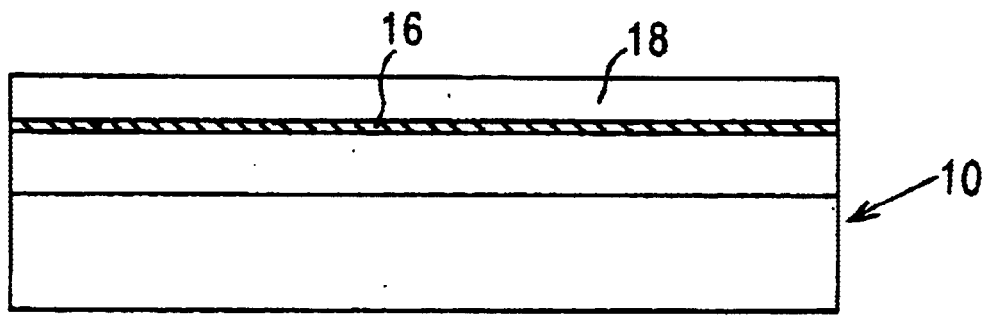

Referring to FIG. 3, after deposition and laser annealing of the gate oxide 16, a gate electrode 18 is formed over the gate oxide 16 in a conventional manner. For example, the formation of the gate electrode 18 typically involves depositing a blanket layer of undoped polysilicon, for example by low pressure chemical vapor deposition (LPCVD) at temperatures from about 600 to 800° C., on the top surface of the gate oxide 16. Although not limited in this manner, the polysilicon layer 18 can have a thickness from about 500 to 5000 angstroms, and be implanted with nitrogen ions.

Figure 4:
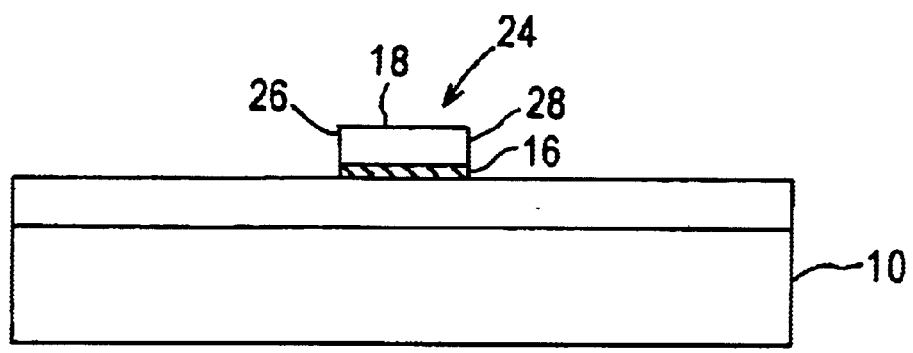

In FIG. 4, the gate oxide and the gate electrode layers 16, 18 are etched in a conventional manner to form the gate 24. For example, the etching of the gate typically involves forming a photoresist (not shown) on the gate electrode layer 18, and the photoresist is selectively irradiated using a photolithographic system, such as a step and repeat optical projection system, in which ultraviolet light from a mercury-vapor lamp is projected through a first reticle and a focusing lens to obtain a first image pattern. The photoresist is then developed, and the irradiated portions of the photoresist are removed to provide openings in the photoresist. The openings expose portions of the gate electrode layer 18, which will thereby define the gate electrode. An etch, typically anisotropic, is applied to remove the exposed portions of the gate electrode layer 18 and the underlying portions of the gate oxide 16. After etching, the remaining portion of the gate electrode layer 18, provides a gate 24 having opposing vertical sidewalls 26, 28. Although not limited in this manner, the width of the gate electrode 24 between the sidewalls 26, 28 can be from about 500 to 2500 angstroms.

Figure 5:
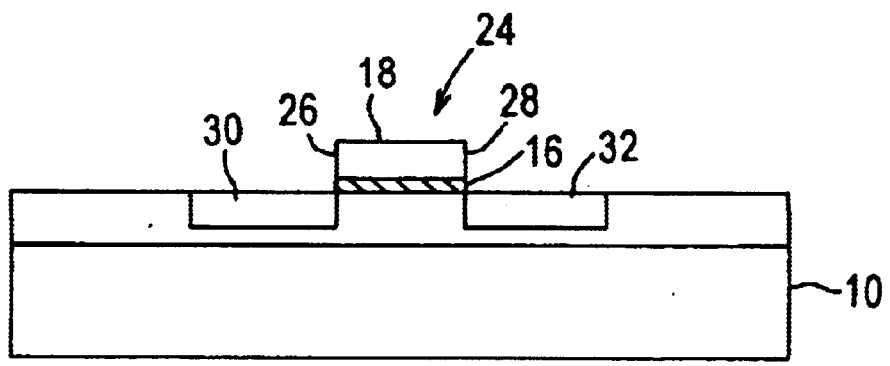

In FIG. 5, lightly doped (LDD) source/drain extensions 30, 32 are formed in a conventional manner. For example, the source/drain extensions 30, 32 are typically formed through ion implantation of n-type and p-type dopants. The source/drain extensions 30, 32 are formed within the substrate 10 immediately adjacent to the sidewalls 26, 28 and are self-aligned with the gate electrode 24. After implantation, annealing is conducted to activate the source/drain extensions 30, 32 and to recrystallize the extensions. The annealing of the source/drain extensions 30, 32 is not limited as to a particular method. For example, rapid thermal anneal or laser thermal annealing can be used. Typically, the source/drain extensions 30, 32 extend down from the surface of the silicon substrate 10 to a depth of about 50 angstroms to 300 angstroms.

Figure 6:
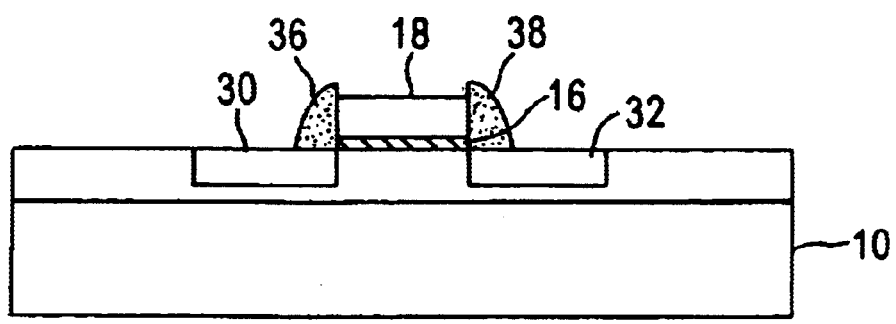
Figure 7:
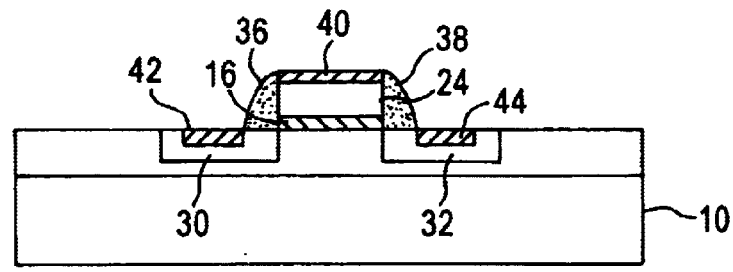

In FIG. 6, sidewall spacers 36, 38 are formed following the implantation of the source/drain extensions 30, 32. Formation of the sidewall spacers 36, 38 involves blanket depositing a spacer material over the substrate 10. The spacer material can be silicon nitride or some other material such as plasma-enhanced oxide (PEOX) or tetraethoxysilane (TEOS) oxide. The blanket deposition is followed by an anisotropic etch, which removes the spacer material except for the sidewall spacers 36, 38 immediately adjacent to the sidewalls 26, 28 of the gate electrode 24 and over the substrate 10. As shown in FIG. 7, silicide layers 40, 42, 44 are formed on the gate 24 and the source/drain extensions 30, 32, respectively. The silicide layers 40, 42, 44 are used to lower the resistance between the silicon of the gate 24 and the source/drain extensions 30, 32, and contacting metal plugs (not shown). The silicide layers 40, 42, 44 are typically formed by depositing titanium, tungsten or cobalt (e.g., through chemical vapor deposition) and siliciding the layers.

The present invention, therefore, provides an improved method for forming a gate oxide film over a substrate including depositing at least one layer of a gate oxide film over a substrate using a chemical vapor deposition, and conditioning the layer of gate oxide film using laser thermal annealing. Among other advantages, the method of the present invention produces gate oxide films having a uniform thickness and a controlled microstructure, and that are relatively free of stress, voids, and excess carbon and organic surface material.

Annealing by laser is a well-understood process that correlates strongly to conventional oven annealing.

However, lasers offer a few advantages over conventional heating sources. For example, the induction or flow of heat energy into the desired substrate is more rapid. Turning off the laser instantly turns off the heating source. Lasers allow much more efficient control of the size of the area to be heated, whether large or localized. The variety of lasers available (in terms of wavelength, power, and pulse width) allows flexibility in dealing with diverse substrates and materials. Laser heating can also produce temperature ramping where desired. All of these processes can easily be controlled by computer for purposes of automation and precise control of heating rates.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well-known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concepts as expressed herein.

What is claimed is:

1. A method of manufacturing a semiconductor device, comprising:
    depositing a gate oxide film over a substrate and conditioning the deposited gate oxide film using laser thermal annealing in a single process chamber; and
    depositing a gate electrode film over the conditioned gate oxide film.

2. The method of manufacturing a semiconductor device according to claim 1, wherein the gate oxide film is deposited using chemical vapor deposition.

3. The method of manufacturing a semiconductor device according to claim 2, wherein the gate oxide film is deposited in successive layers, and each layer is laser thermal annealed.

4. The method of manufacturing a semiconductor device according to claim 2, wherein the gate oxide film is deposited using atomic layer chemical vapor deposition.

5. The method of manufacturing a semiconductor device according to claim 2, wherein the gate oxide film is deposited using metal-organic chemical vapor deposition.

6. The method of manufacturing a semiconductor device according to claim 1, wherein the laser thermal annealing includes melting the gate oxide film at a relatively low power and allowing the melted film to cool relatively rapidly.

7. The method of manufacturing a semiconductor device according to claim 6, wherein the gate oxide film is laser thermal annealed such that the film has a substantially uniform grain size of between about 10 and about 100 angstroms.

8. The method of manufacturing a semiconductor device according to claim 1, wherein the gate oxide film has a thickness of about 10 to 100 angstroms.

9. The method of manufacturing a semiconductor device according to claim 1, wherein the laser thermal annealing melts amorphitized regions of the gate oxide film and does not melt recrystallized regions of the gate oxide film.

10. The method of manufacturing a semiconductor device according to claim 1, wherein the semiconductor device is a CMOS.

11. The method of manufacturing a semiconductor device according to claim 1, wherein the gate oxide film comprises a standard-K dielectric material.

12. The method of manufacturing a semiconductor device according to claim 1, wherein the gate oxide film comprises a mid-K dielectric material.

13. The method of manufacturing a semiconductor device according to claim 1, wherein the gate oxide film comprises a high-K dielectric material.

14. The method of manufacturing a semiconductor device according to claim 1, wherein the gate oxide film comprises at least one of hafnium oxide ($HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate (PbTiO3), strontium titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$) PZN ($PbZn_xNb_{1-x}O_3$), and PST ($PbSc_xTa_{1-x}O_3$).

15. The method of manufacturing a semiconductor device according to claim 1, wherein the gate oxide film comprises at least one of silicon dioxide, silicon nitride, silicon oxynitride and aluminum oxide.

* * * * *